US012684744B2

(12) United States Patent
Khunte et al.

(10) Patent No.: US 12,684,744 B2
(45) Date of Patent: Jul. 14, 2026

(54) POWER CONVERTERS WHICH ARE SCALABLE AND/OR PROVIDE A HIGH DEGREE OF PACKAGING DENSITY

(71) Applicant: Cummins Inc., Columbus, IN (US)

(72) Inventors: Abhishek Khunte, Pune (IN); Gautam M. Ghaisas, Pune (IN); Vasant Rawool, Pune (IN)

(73) Assignee: Cummins Inc., Columbus, IN (US)

( * ) Notice: Subject to any disclaimer, the term of this patent is extended or adjusted under 35 U.S.C. 154(b) by 137 days.

(21) Appl. No.: 18/914,533

(22) Filed: Oct. 14, 2024

(65) Prior Publication Data

US 2025/0176147 A1 May 29, 2025

Related U.S. Application Data

(60) Provisional application No. 63/602,942, filed on Nov. 27, 2023.

(51) Int. Cl.
*H05K 7/20* (2006.01)
*H02M 7/00* (2006.01)
*H05K 1/02* (2006.01)

(52) U.S. Cl.
CPC ............ *H05K 7/209* (2013.01); *H02M 7/003* (2013.01); *H05K 1/0209* (2013.01); *H05K 7/20318* (2013.01); *H05K 7/20336* (2013.01); *H05K 7/20936* (2013.01)

(58) Field of Classification Search
CPC .. H05K 7/209; H05K 1/0209; H05K 7/20318; H05K 7/20336; H05K 7/20936; H02M 7/003
See application file for complete search history.

(56) References Cited

U.S. PATENT DOCUMENTS

| | | | |
|---|---|---|---|
| 7,106,595 B2 | 9/2006 | Foster, Sr. et al. | |
| 8,272,877 B2 | 9/2012 | Stokoe et al. | |
| 9,606,589 B2 | 3/2017 | Gallina et al. | |
| 9,730,365 B2 | 8/2017 | Mari Curbelo et al. | |
| 9,750,127 B2 | 8/2017 | Kim et al. | |
| 9,996,495 B2 | 6/2018 | Feldman et al. | |
| 10,577,994 B2 * | 3/2020 | Mittal | F01N 3/208 |
| 11,637,504 B1 * | 4/2023 | Waltrich | H02M 1/0054 |
| | | | 361/749 |
| 2003/0132040 A1 * | 7/2003 | Radosevich | B60L 50/15 |
| | | | 180/65.1 |

(Continued)

*Primary Examiner* — Yusef A Ahmed
(74) *Attorney, Agent, or Firm* — Taft, Stettinius & Hollister LLP

(57) ABSTRACT

A power converter apparatus includes a parent circuit board including a first surface, a second surface, and a thermal conductor core disposed intermediate the first surface and the second surface. A first child circuit is board mounted on the parent circuit board. A first plurality of power switches are operatively coupled with the first child circuit board. A second child circuit is board operatively coupled with the parent circuit board. A second plurality of power switches are operatively coupled with the second child circuit board. A first heat transfer circuit includes a first set of conductors thermally conductively coupling the first plurality of power switches with the thermal conductor core. A second heat transfer circuit includes a second set of conductors thermally conductively coupling the second plurality of power switches with the thermal conductor core.

20 Claims, 5 Drawing Sheets

(56) References Cited

U.S. PATENT DOCUMENTS

| | | | | |
|---|---|---|---|---|
| 2003/0133283 A1* | 7/2003 | Beihoff | .................. | H02M 1/44 |
| | | | | 361/818 |
| 2003/0133319 A1* | 7/2003 | Radosevich | ......... | H02M 7/003 |
| | | | | 363/141 |
| 2005/0286229 A1 | 12/2005 | Ku | | |
| 2006/0109623 A1* | 5/2006 | Harris | ................... | H05K 1/141 |
| | | | | 257/E23.099 |
| 2006/0109626 A1* | 5/2006 | Harris | ................ | H05K 7/1092 |
| | | | | 361/695 |
| 2006/0126297 A1* | 6/2006 | Belady | ................ | H10W 40/22 |
| | | | | 257/E23.102 |
| 2006/0133040 A1* | 6/2006 | Belady | .............. | H05K 7/20436 |
| | | | | 361/719 |
| 2016/0025430 A1* | 1/2016 | Dede | ...................... | F28F 13/14 |
| | | | | 165/185 |
| 2018/0151466 A1* | 5/2018 | Hsu | .................... | H10W 40/228 |
| 2018/0241285 A1* | 8/2018 | Sasaki | ................. | H05K 1/0204 |
| 2019/0141854 A1* | 5/2019 | Ku | .......................... | G06F 1/206 |
| 2020/0146174 A1* | 5/2020 | Song | ....................... | H05K 3/32 |
| 2021/0185817 A1* | 6/2021 | Fujii | ........................ | H05K 7/20 |
| 2022/0022323 A1 | 1/2022 | Housden et al. | | |
| 2022/0053634 A1 | 2/2022 | Zhou et al. | | |
| 2022/0141951 A1* | 5/2022 | Zhou | ..................... | H05K 1/185 |
| | | | | 361/700 |
| 2022/0258571 A1* | 8/2022 | Tamai | ................. | B60H 1/3229 |
| 2022/0361315 A1* | 11/2022 | Zhou | ..................... | H05K 1/181 |
| 2023/0156964 A1* | 5/2023 | Lee | ....................... | H02M 3/003 |
| | | | | 361/699 |
| 2023/0383679 A1* | 11/2023 | Brand | ...................... | F01N 9/00 |
| 2024/0049380 A1* | 2/2024 | Mohr | ................... | H05K 1/0209 |
| 2024/0206066 A1* | 6/2024 | Chun | .................... | H05K 1/142 |
| 2024/0341041 A1* | 10/2024 | Mastrodemos | ........ | H05K 3/366 |

* cited by examiner

POWER CONVERTERS WHICH ARE SCALABLE AND/OR PROVIDE A HIGH DEGREE OF PACKAGING DENSITY

CROSS-REFERENCE

The present disclosure claims priority to and the benefit of U.S. Application No. 63/602,942 filed Nov. 27, 2023, and the same is hereby incorporated by reference.

BACKGROUND

The present disclosure relates generally to power converters and more particularly but not exclusively to power converters which are scalable and/or provide a high degree of packaging density. A number of power converters have been proposed. Existing approaches to power converters suffer from a number of disadvantages, drawbacks, problems, and shortcomings including those respecting density, package form factor, volume, scalability, and heat dissipation, among others. There remains a significant need for the unique apparatuses, processes, and systems disclosed herein.

DISCLOSURE OF EXAMPLE EMBODIMENTS

For the purposes of clearly, concisely, and exactly describing example embodiments of the present disclosure, the manner, and process of making and using the same, and to enable the practice, making and use of the same, reference will now be made to certain example embodiments, including those illustrated in the figures, and specific language will be used to describe the same. It shall nevertheless be understood that no limitation of the scope of the invention is thereby created, and that the invention as set forth in the claims following this disclosure includes and protects such alterations, modifications, and further applications of the example embodiments as would occur to one skilled in the art with the benefit of the present disclosure.

SUMMARY OF THE DISCLOSURE

Some embodiments include unique power converter apparatus. Some embodiments include unique power converter systems. Some embodiments include unique power converter processes. Further embodiments, forms, objects, features, advantages, aspects, and benefits shall become apparent from the following description and drawings.

DETAILED DESCRIPTION OF EXAMPLE EMBODIMENTS

Figure 1:
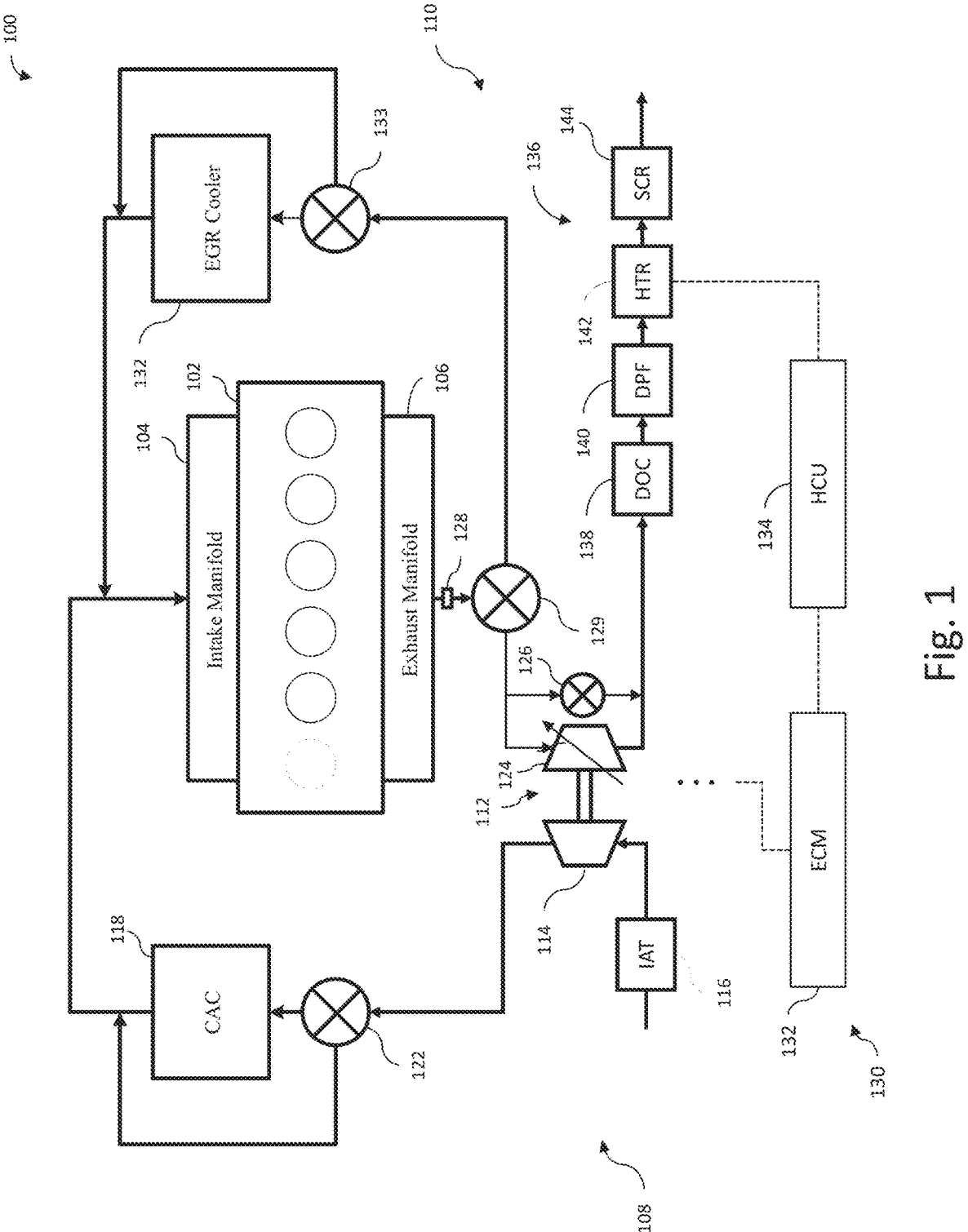
FIG. 1 is a schematic diagram illustrating certain aspects of an example system including a power converter apparatus.

With reference to FIG. 1, there is illustrated an example prime mover system 100 (also referred to herein as system 100) including a prime mover in the form of an internal combustion engine (ICE) 102. System 100 may be provide in a number of forms including, for example, in the form of a vehicle or vehicle powertrain system (e.g., an on-highway vehicle or vehicle powertrain system or an off-highway vehicle or vehicle powertrain system), a work machine or work machine powertrain system, a genset or genset powertrain system, or a hydraulic fracturing rig or hydraulic fracturing rig powertrain system, to name several non-limiting examples. In shall be appreciated that system 100 may include a number of other components as will occur to one of skill in the art with the benefit and insight of the present disclosure. Furthermore, while engine 102 is provided as a prime mover of system 100 in the illustrated embodiment, other embodiments may comprise other types of prime movers, for example, battery electric drive systems, hybrid ICE-battery electric systems, a fuel cell electric drive system, or prime mover systems comprising combinations of the foregoing and/or other types of prime mover system as will occur to one of skill in the art with the benefit and insight of the present disclosure.

System 100 includes an intake system 108 and an exhaust system 110. The engine 102 is in fluid communication with the intake system 108 through which charge air enters an intake manifold 104 and is also in fluid communication with the exhaust system 110, through which exhaust gas resulting from combustion exits by way of an exhaust manifold 106. The engine 102 includes a number of cylinders (e.g., cylinders 1 through 6) forming combustion chambers in which a charge flow mixture of fuel and air is combusted. For example, the energy released by combustion powers the engine 102 via pistons in the cylinders connected to a crankshaft. Intake valves control the admission of charge air into the cylinders, and exhaust valves control the outflow of exhaust gas through exhaust manifold 106 and ultimately to the atmosphere. It shall be appreciated that the exhaust manifold 106 may be a single manifold or multiple exhaust manifolds.

The turbocharger 112 includes a compressor 114 configured to receive filtered intake air via an intake air throttle (IAT) 116 of the intake system 108 and operable to compress ambient air before the ambient air enters the intake manifold 104 of the engine 102 at increased pressure. The air from the compressor 114 is pumped through the intake system 108, to the intake manifold 104, and into the cylinders of the engine 102, typically producing torque on the crankshaft. IAT 116 is flow coupled with a charge air cooler (CAC) 120 which is operable to cool the charge flow provided to the intake manifold 104. The intake system 108 also includes a CAC bypass valve 122 which can be opened to route a portion or all of the charge flow to bypass the CAC 120. Adjusting the bypass position of the CAC bypass valve 122 increasingly raises the temperature of the gas returned to the intake manifold 104.

It is contemplated that in system 100, the turbocharger 112 may be a variable geometry turbocharger (VGT) or a fixed geometry turbocharger. A variable geometry turbine allows significant flexibility over the pressure ratio across the turbine. In diesel engines, for example, this flexibility can be used for improving low speed torque characteristics, reducing turbocharger lag and driving exhaust gas recirculation flow. In an example embodiment, the VGT 124 can be adjusted to increase engine load and thereby configured to increase exhaust gas temperature. System 100 also includes a turbine bypass valve 126 to bypass the turbocharger 112. Since cooler ambient air is introduced at the turbocharger 112, opening the turbine bypass valve 126 allows for the turbocharger 112 to be bypassed and maintain a higher intake air temperature at the intake manifold 104.

The exhaust system 110 includes an exhaust gas temperature sensor 128 to sense the temperature of the gas exiting the exhaust manifold 106. The exhaust system 110 includes an exhaust gas recirculation (EGR) valve 129 which recirculates a portion of exhaust gas from the exhaust manifold 106 back to the intake manifold 104. The exhaust system 110 includes an EGR cooler (EGR-C) 118 which cools the gas exiting the exhaust manifold 106 before the gas returns to the intake manifold 104. The exhaust system 110 may also include an EGR-C bypass valve 133 which can be opened to route a portion or all of the recirculated exhaust gas from the exhaust manifold 106 to bypass the EGR-C 118. By increasing the amount of gas that bypasses the EGR-C 118, the temperature of the gas returning to the intake manifold 104 is increased. It shall be appreciated that the intake system 108 and/or the exhaust system 110 may further include various components not shown, such as additional coolers, valves, bypasses, intake throttle valves, exhaust throttle valves, and/or compressor bypass valves, for example.

System 100 includes an exhaust aftertreatment (AT) system 136 which includes a diesel oxidation catalyst (DOC) 138, a diesel particulate filter (DPF) 140, aftertreatment (AT) heater 142, and a selective catalytic reduction (SCR) 144. In the example embodiment, the AT heater 142 is optionally included in the AT system 136 to increase the temperature of the exhaust gas provided to the SCR 144 within the AT system 136. It should be noted that AT heater 142 can include one or more electric heaters distributed at various locations at, on, within, or upstream of SCR 144 or other catalyst elements of AT system 136.

System 100 includes an electronic control system (ECS) 130. In the illustrated embodiment, ECS 130 include an engine control unit (ECU) 132 and a heater control unit (HCU) 134 which are operatively communicatively coupled with one another. System 100 may include a number of other control units and controller as will occur to one of skill in the art with the benefit and insight of the present disclosure.

ECU 132 is operatively communicatively coupled with and configured and operable to control operation of and/or receive inputs from actuators, controllers, devices, sensors, and/or other components of system 100 including, for example, a number of the aforementioned features of system 100. HCU 134 is operatively coupled with and configured and operable to control operation of and/or receive inputs from AT heater 142. It shall be appreciated that various communications hardware and protocols may be utilized to implement, such as one or more controller area networks (CAN) or other communications components.

ECU 132, HCU 134, and other components of ECS 130 may include one or more programmable controllers of a solid-state, integrated circuit type, and one or more non-transitory memory media configured to store instructions executable by the one or more microcontrollers. For purposes of the present application the term controller shall be understood to also encompass microcontrollers, microprocessors, application specific integrated circuits (ASIC), other types of integrated circuit processors and combinations thereof.

ECU 132, HCU 134, and other components of ECS 130 may be implemented in any of a number of ways that combine or distribute the control function across one or more control units in various manners. The ECS 130 may execute operating logic that defines various control, management, and/or regulation functions. This operating logic may be in the form of dedicated hardware, such as a hardwired state machine, analog calculating machine, programming instructions, and/or a different form as would occur to those skilled in the art. The ECS 130 may be provided as a single component or a collection of operatively coupled components; and may be comprised of digital circuitry, analog circuitry, or a hybrid combination of both of these types. When of a multi-component form, the ECS 130 may have one or more components remotely located relative to the others in a distributed arrangement. The ECS 130 can include multiple processing units arranged to operate independently, in a pipeline processing arrangement, in a parallel processing arrangement, or the like. It shall be further appreciated that the ECS 130 and/or any of its constituent components may include one or more signal conditioners, modulators, demodulators, Arithmetic Logic Units (ALUs), Central Processing Units (CPUs), limiters, oscillators, control clocks, amplifiers, signal conditioners, filters, format converters, communication ports, clamps, delay devices, memory devices, Analog to Digital (A/D) converters, Digital to Analog (D/A) converters, and/or different circuitry or components as would occur to those skilled in the art to perform the desired communications.

ECU 132, HCU 134, and other components of ECS 130 may include one or more non-transitory memory devices configured to store instructions in memory which are readable and executable by a controller to control operation of engine 102 as described herein. Certain control operations described herein include operations to determine one or more parameters. ECU 132, HCU 134, and other components of ECS 130 may be configured to determine and may perform acts of determining in a number of manners, for example, by calculating or computing a value, obtaining a value from a lookup table or using a lookup operation, receiving values from a datalink or network communication, receiving an electronic signal (e.g., a voltage, frequency, current, or pulse-width modulation (PWM) signal) indicative of the value, receiving a parameter indicative of the value, reading the value from a memory location on a computer-readable medium, receiving the value as a run-time parameter, and/or by receiving a value by which the interpreted parameter can be calculated, and/or by referencing a default value that is interpreted to be the parameter value.

Figure 2:
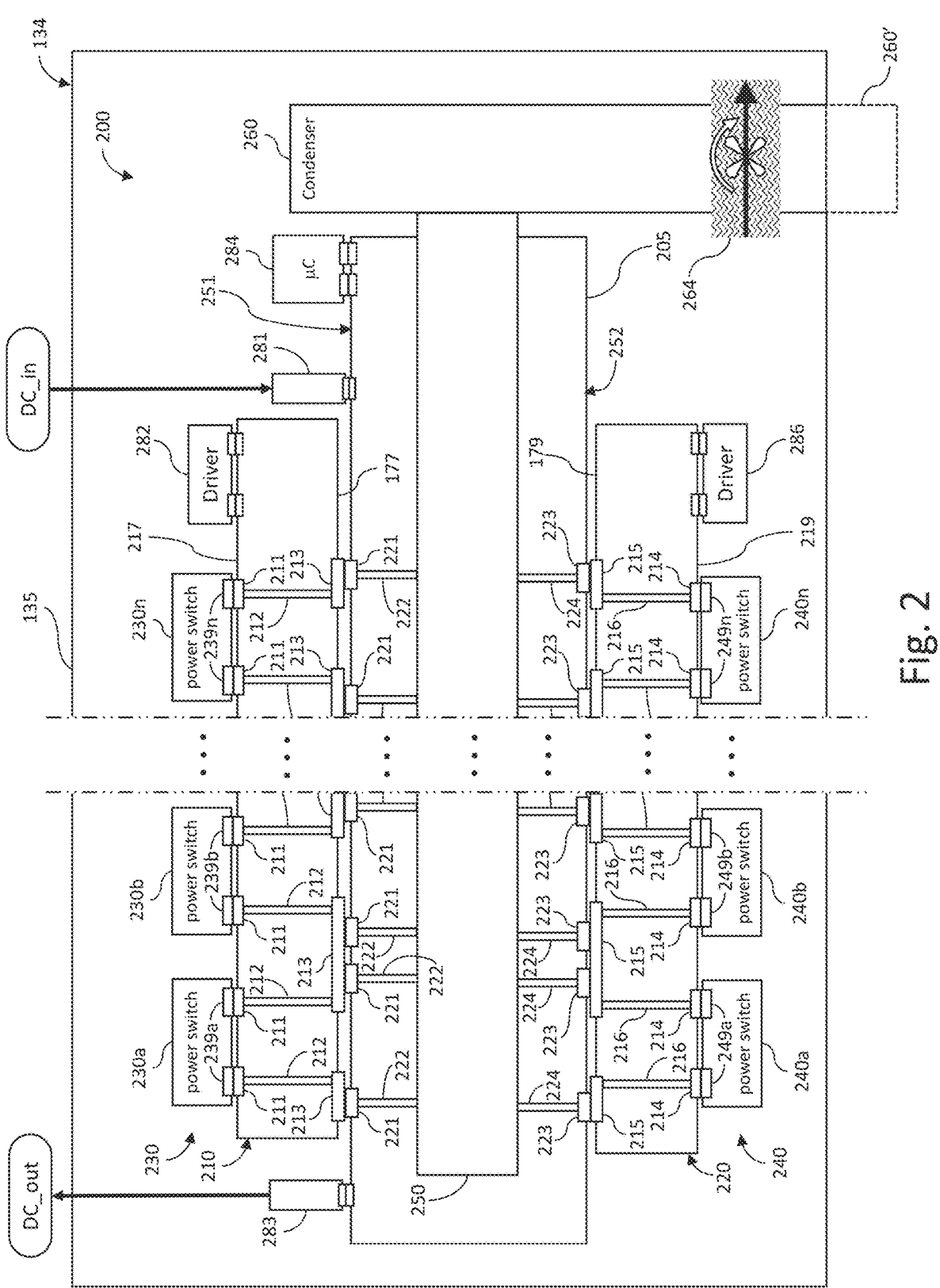
FIG. 2 is a partially schematic diagram illustrating certain aspects of an example power converter.

With reference to FIG. 2, there are illustrated further details of an example embodiment of HCU 134. In the illustrated example, HCU 134 includes a housing 135 containing a power converter 200. In the illustrated embodiment, power converter 200 is provided in the form of a DC-DC converter which is configured and operable to boost DC input power (DC_in) and provide boosted DC output power (DC_out) to drive AT heater 142. A number of other forms and applications of power converter 200 are contemplated including, for example, AC-DC converters, AC-DC-AC converters, and other types of converters as will occur to one of skill in the art with the benefit and insight of the present disclosure.

Power converter 200 includes a parent circuit board 205 comprising a surface 251 facing a first direction, a surface 252 facing a second direction oriented away from the first direction, and a thermal conductor core 250 disposed intermediate the surface 251 and the surface 252. In the illustrated embodiment the surface 251 and the surface 252 are oriented generally in opposite directions from one another may be considered to be positioned on opposite sides of the parent circuit board 205.

In the embodiment of FIG. 2, thermal conductor core 250 is configured and provided as a thermally conductive bus bar. The thermally conductive bus bar may comprise, for example, a copper bus bar which is embedded in or otherwise operatively coupled with the parent circuit board 205 and which is conductively thermally coupled with a condenser such as condenser 260. In other embodiments, the thermally conductive bus bar may comprise a heat pipe, for example, heat pipe 350 which is illustrated and described in connection with FIG. 5.

Power converter 200 includes a child circuit board 210 which is operatively coupled with the surface 251 of the parent circuit board 205. A plurality of power switches 230 are operatively coupled with the child circuit board 210. In the illustrated embodiment, the plurality of power switches 230 are configured and provide in the form of packaged, surface-mount devices (SMD) which are operatively coupled with the child circuit board 210 using a surface-mount technique (SMT). The plurality of power switches 230 are further configured and provided in an orientation generally facing away from the parent circuit board 205, but may be differently oriented in other embodiments. In other embodiments, the plurality of power switches 230 may be configured and provide in other forms and may be operatively coupled with the child circuit board 210 using other techniques. In some embodiments, the plurality of power switches 230 may be configured and provide in the form through-hole mount devices and may be operatively coupled with the child circuit board 210 using through-hole mounting techniques. In some embodiments, the plurality of power switches 230 may be configured and provide in the form of embedded die devices and may be operatively coupled with the child circuit board 210 using PCB embedding techniques such as chip-on-substrate techniques, chip-in-cavity techniques, double-side micro-via techniques, or other PCB embedding techniques. In some embodiments, the plurality of power switches 230 may be configured and provide in the form of bare die devices and may be operatively coupled with the child circuit board 210 using bare die surface-mount techniques, bare die PCB embedding techniques, or other bare die mounting techniques. It shall be further appreciated that combinations and hybridizations of the foregoing and other techniques are contemplated in some embodiments.

In the illustrated embodiment, the plurality of power switches 230 include power switch 230a, power switch 230b, and power switch 230n (also referred to herein as power switches 230a-n). Other embodiments may comprise a greater number of power switches or a lesser number of power switches. The plurality of power switches 230 may be configured and provided in a number of forms, for example, as metal oxide semiconductor field effect transistors (MOS-FETs), insulated gate bipolar transistors (IGBTs), or other types of power switching devices as understood by one of skill in the art with the benefit of the present disclosure.

The plurality of power switches 230 are configured and provided with respective sets of terminals. In the illustrated embodiment, power switch 230a includes a set of terminals comprising at least two terminals 239a, power switch 230b includes a set of terminals comprising at least two terminals 239b, and power switch 230n includes a set of terminals comprising at least two terminals 239n. In other embodiments, one or more of the plurality of power switches 230 may be provided with sets of terminals comprising a different number of terminals.

Figure 3:
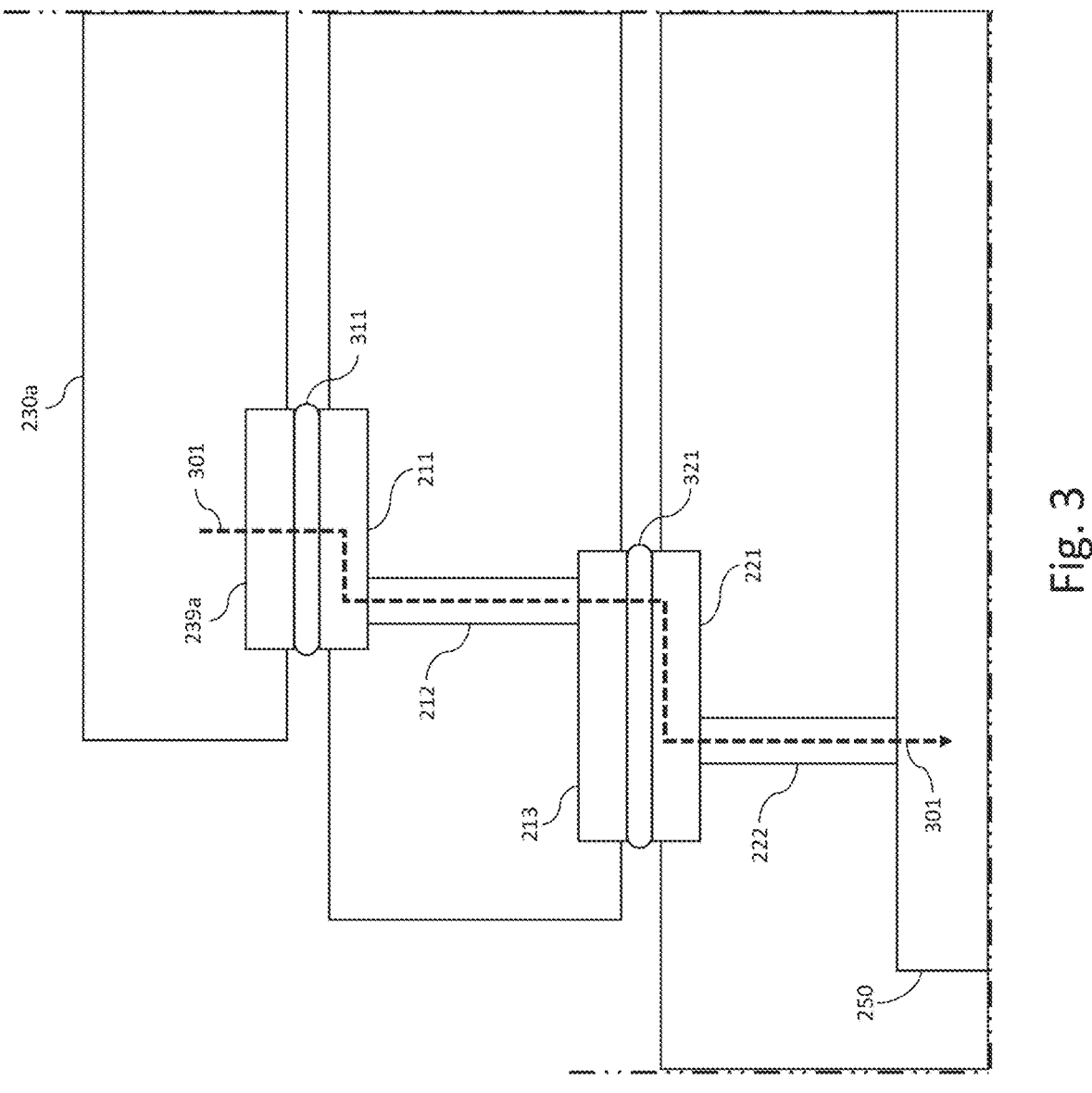
FIG. 3 is an enlarged view of a portion of the power converter of FIG. 2.

Terminals 239a, 239b, and 239n are soldered with corresponding ones of a plurality of mounting pads 211 disposed on a surface 217 of the child circuit board 210 effective to provide mechanical and thermal coupling of power switch 230a, power switch 230b, and power switch 230n, respectively, with the child circuit board 210. For example, a solder joint 311 mechanically and thermally coupling one of terminals 239a of power switch 230a with a corresponding one of the plurality of mounting pads 211 is illustrated in FIG. 3. Substantially similar solder joints may be provided for other terminals of the plurality of power switches 230 and the child circuit board 210. While the plurality of mounting pads 211 and various other mounting pads illustrated and described herein are configured and provided as an example form of SMT-type pads, it shall be appreciated that other embodiments contemplate mounting pads of other configurations and forms including, for example, bare die-type pads, bumped-type pads, chip-on-substrate-type pads, chip-in-cavity-type pads, flip chip-type pads, micro-via-type pads, solder flip chip-type pads, under fill encapsulation-type pads, wire bond-type pads, and other pads of various configurations, dimensions, and sizes.

Child circuit board 210 includes a plurality of vias 212 thermally conductively coupled with the plurality of mounting pads 211, extending through child circuit board 210, and thermally conductively coupled with a plurality of mounting pads 213 disposed on a surface 177 of child circuit board 210. The plurality of vias 212 may comprise plated through vias, conductor-filled vias, or combinations of these and/or other types of vias as will occur to one of skill in the art with the benefit and insight of the present disclosure. It shall be appreciated that vias extending through a circuit board according to the present disclosure, for example, the plurality of vias 212 and the child circuit board 210 as well as the other vias and circuit boards disclosed herein, may extend completely through a circuit board, partially through a circuit board, partially into a circuit board, and/or may otherwise extend relative to a circuit board in various configurations facilitating conductive heat transfer through or from a circuit board.

The plurality of mounting pads 213 are soldered with corresponding ones of a plurality of mounting pads 221 disposed on the surface 251 of the parent circuit board 205. For example, a solder joint 321 mechanically and thermally coupling a one of the plurality of mounting pads 213 with a corresponding one of the plurality of mounting pads 221 is illustrated in FIG. 3. Substantially similar solder joints may be provided for other ones of the plurality of mounting pads 213 of the child circuit board 210 and corresponding ones of the plurality of mounting pads 221 of the parent circuit board 205.

Parent circuit board 205 includes a plurality of vias 222 thermally conductively coupled with the plurality of mounting pads 221, extending through parent circuit board 205, and thermally conductively coupled with the thermal conductor core 250 of parent circuit board 205. The plurality of vias 222 may comprise plated through vias, conductor-filled vias, or combinations of these and/or other types of vias as will occur to one of skill in the art with the benefit and insight of the present disclosure.

The aforementioned mounting pad and via structures provide a plurality of heat transfer circuits comprising respective sets of conductors thermally conductively coupling the plurality of power switches 230 with the thermal conductor core 250. For example, as illustrated in FIG. 3, a heat transfer circuit 301 thermally conductively coupling power switch 230a and thermal conductor core 250 comprises one of terminals 239a, solder joint 311, one of the plurality of mounting pads 211, one of the plurality of vias 212, one of the plurality of mounting pads 213, solder joint 321, one of the plurality of mounting pads 221, one of the plurality of vias 222, and the thermal conductor core 250. It shall be appreciated that additional heat transfer circuits thermally conductively coupling the plurality of power switches 230 with the thermal conductor core 250 are provided by other respective sets of mounting pads and vias such as those illustrated and described in connection with FIG. 1. It shall be appreciated that conductors forming heat transfer circuits according to the present disclosure generally refer to thermally conductive structures providing increased thermal conductivity or decreased thermal resistivity relative to adjacent, adjoining, proximate, or surrounding structures and may include, for example, conductors comprising metal and/or other thermal conductors.

Power converter 200 includes a child circuit board 220 which is operatively coupled with the surface 252 of the parent circuit board 205. In the illustrated embodiment, the surface 252 of the parent circuit board 205 and the plurality of power switches 240 are oriented to face in an opposite direction from the surface 251 of the child circuit board 210 and the plurality of power switches 230 and may be described as being positioned on opposite sides of the parent circuit board 205. Other embodiments contemplate a variety of other orientations, for example, perpendicular orientations or other orientations depending on the geometry of the parent circuit board 205.

A plurality of power switches 240 are operatively coupled with the child circuit board 220. In the illustrated embodiment, the plurality of power switches 240 are configured and provide in the form of packaged, surface-mount devices (SMD) which are operatively coupled with the child circuit board 220 using a surface-mount technique (SMT). The plurality of power switches 240 are further configured and provided in an orientation generally facing away from the parent circuit board 205, but may be differently oriented in other embodiments. In other embodiments, the plurality of power switches 240 may be configured and provide in other forms and may be operatively coupled with the child circuit board 220 using other techniques. In some embodiments, the plurality of power switches 240 may be configured and provide in the form through-hole mount devices and may be operatively coupled with the child circuit board 220 using through-hole mounting techniques. In some embodiments, the plurality of power switches 240 may be configured and provide in the form of embedded die devices and may be operatively coupled with the child circuit board 220 using PCB embedding techniques such as chip-on-substrate techniques, chip-in-cavity techniques, double-side micro-via techniques, or other PCB embedding techniques. In some embodiments, the plurality of power switches 240 may be configured and provide in the form of bare die devices and may be operatively coupled with the child circuit board 220 using bare die surface-mount techniques, bare die PCB embedding techniques, or other bare die mounting techniques. It shall be further appreciated that combinations and hybridizations of the foregoing and other techniques are contemplated in some embodiments.

In the illustrated embodiment, the plurality of power switches 240 include power switch 240a, power switch 240b, and power switch 240n (also referred to herein as power switches 240a-n). Other embodiments may comprise a greater number of power switches or a lesser number of power switches. The plurality of power switches 240 may be configured and provided in a number of forms, for example, as metal oxide semiconductor field effect transistors (MOS-FETs), insulated gate bipolar transistors (IGBTs), or other types of power switching devices as understood by one of skill in the art with the benefit of the present disclosure.

The plurality of power switches 240 are configured and provided with respective sets of terminals. In the illustrated embodiment, power switch 240a includes a set of terminals comprising at least two terminals 249a, power switch 240b includes a set of terminals comprising at least two terminals 249b, and power switch 240n includes a set of terminals comprising at least two terminals 249n. In other embodiments, one or more of the plurality of power switches 240 may be provided with sets of terminals comprising a different number of terminals.

Figure 4:
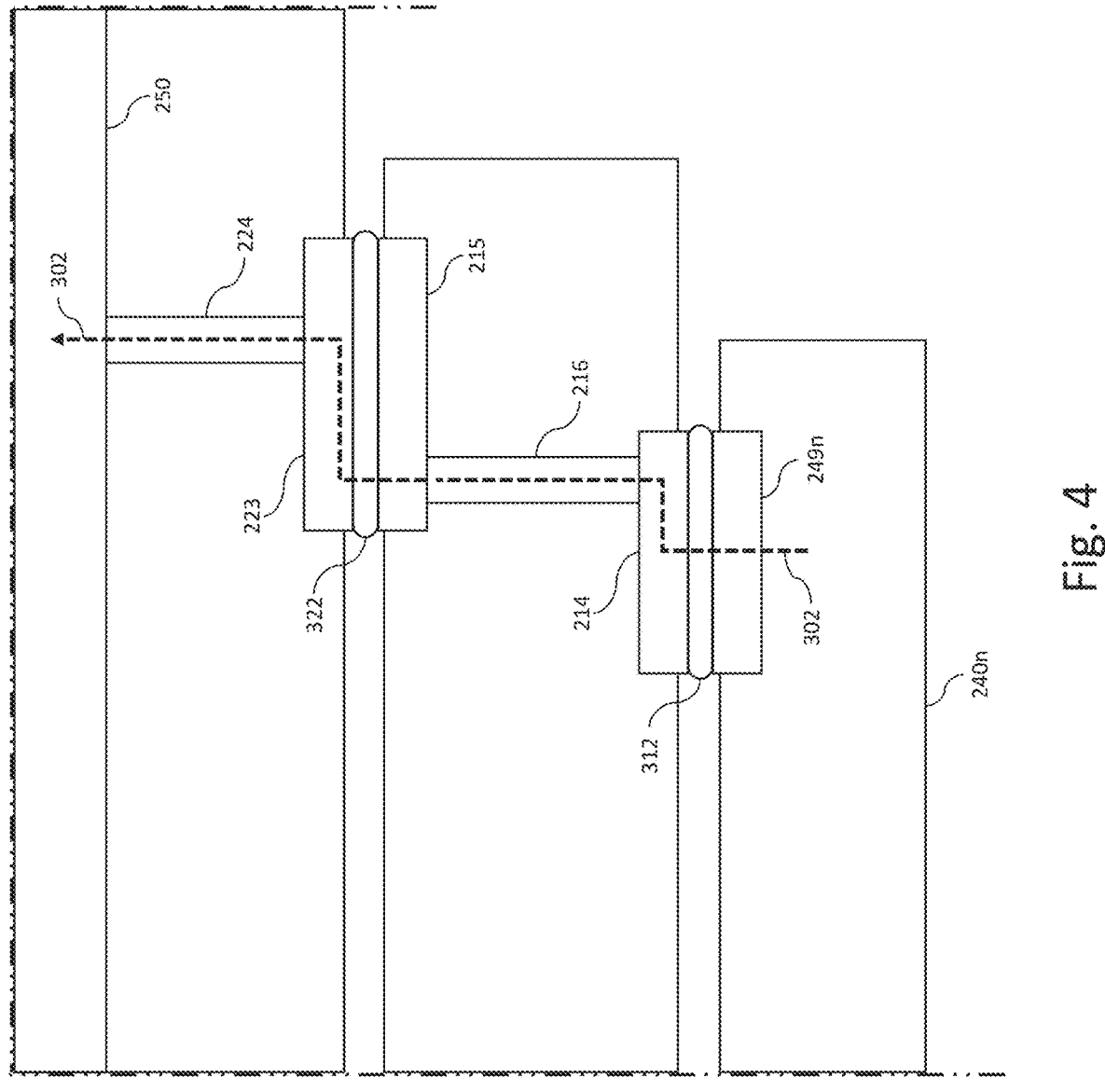
FIG. 4 is an enlarged view of another portion of the power converter of FIG. 2.

Terminals 249a, 249b, and 249n are soldered with corresponding ones of a plurality of mounting pads 214 disposed on a surface 219 of the child circuit board 220 effective to provide mechanical and thermal coupling of power switch 240a, power switch 240b, and power switch 240n, respectively, with the child circuit board 220. For example, a solder joint 312 mechanically and thermally coupling one of terminals 249a of power switch 240a with a corresponding one of the plurality of mounting pads 214 is illustrated in FIG. 4. Substantially similar solder joints may be provided for other terminals of the plurality of power switches 240 and the child circuit board 220.

Child circuit board 220 includes a plurality of vias 216 thermally conductively coupled with the plurality of mounting pads 214, extending through child circuit board 220, and thermally conductively coupled with a plurality of mounting pads 215 disposed on a surface 179 of child circuit board 220. The plurality of vias 216 may comprise plated through vias, conductor-filled vias, or combinations of these and/or other types of vias as will occur to one of skill in the art with the benefit and insight of the present disclosure.

The plurality of mounting pads 215 are soldered with corresponding ones of a plurality of mounting pads 223 disposed on the surface 252 of the parent circuit board 205. For example, a solder joint 322 mechanically and thermally coupling a one of the plurality of mounting pads 215 with a corresponding one of the plurality of mounting pads 223 is illustrated in FIG. 4. Substantially similar solder joints may be provided for other ones of the plurality of mounting pads 215 of the child circuit board 220 and corresponding ones of the plurality of mounting pads 223 of the parent circuit board 205.

Parent circuit board 205 includes a plurality of vias 224 thermally conductively coupled with the plurality of mounting pads 223, extending through parent circuit board 205, and thermally conductively coupled with the thermal conductor core 250 of parent circuit board 205. The plurality of vias 224 may comprise plated through vias, conductor-filled vias, or combinations of these and/or other types of vias as will occur to one of skill in the art with the benefit and insight of the present disclosure.

The aforementioned mounting pad and via structures provide a plurality of heat transfer circuits comprising respective sets of conductors thermally conductively coupling the plurality of power switches 240 with the thermal conductor core 250. For example, as illustrated in FIG. 4, a heat transfer circuit 302 thermally conductively coupling power switch 240a and thermal conductor core 250 comprises one of terminals 249a, solder joint 312, one of the plurality of mounting pads 214, one of the plurality of vias 216, one of the plurality of mounting pads 215, solder joint 332, one of the plurality of mounting pads 223, one of the plurality of vias 224, and the thermal conductor core 250. It shall be appreciated that additional heat transfer circuits thermally conductively coupling the plurality of power switches 240 with the thermal conductor core 250 are provided by other respective sets of mounting pads and vias such as those illustrated and described in connection with FIG. 1.

It shall be appreciated that the terminals, mounting pads, vias, and solder joints illustrated and described in connection with FIGS. 2-4 may be dedicated to heat transfer and may be non-participatory in signal communication or electrical power conduction aspects of power converter 200 and provided separately from structures participating in such aspects. In such embodiments, separate electrically conductive terminals mounting pads, solder joints, and vias may be utilized to provide electrical signal communication and electrical power conduction between the plurality of power switches 230, the plurality of power switches 240 and other components of the power converter 200, including the following examples.

As further illustrated in FIG. 1, a microcontroller 284 operatively coupled with the surface 251 of the parent circuit board 205. In other embodiments, and the microcontroller 284 and/or another microcontroller may be operatively coupled with the second surface 251 of the parent circuit board 205 on one or both of child circuit board 210 and child circuit board 220.

Microcontroller 284 is communicatively electrical coupled with driver 282 via one or more electrically conductive signal communication paths which may comprise sets of electrically conductive terminals mounting pads, solder joints, vias, and other components as will occur to one of skill in the art with the benefit and insight of the present disclosure. In the illustrated embodiment, driver 282 is operatively coupled with surface 217 of child circuit board 210. In other embodiments, driver 282 may be operatively coupled with parent circuit board 205 or in other locations.

Driver 282 is communicatively electrical coupled with the plurality of power switches 230 via one or more electrically conductive signal communication paths which may comprise sets of electrically conductive terminals, mounting pads, solder joints, vias, and other components as will occur to one of skill in the art with the benefit and insight of the present disclosure. During operation of power converter 200, driver 282 may receive logical control signals from microcontroller 284 and, in response to the received logical control signals, output driver control signals effective to actuate (e.g., open and close) the plurality of power switches 230.

Microcontroller 284 is communicatively electrical coupled with driver 286 via one or more electrically conductive signal communication paths which may comprise sets of electrically conductive terminals mounting pads, solder joints, vias, and other components as will occur to one of skill in the art with the benefit and insight of the present disclosure. In the illustrated embodiment, driver 286 is operatively coupled with surface 219 of child circuit board 210. In other embodiments, driver 286 may be operatively coupled with parent circuit board 205 or in other locations.

Driver 286 is communicatively electrical coupled with the plurality of power switches 240 via one or more electrically conductive signal communication paths which may comprise sets of electrically conductive terminals, mounting pads, solder joints, vias, and other components as will occur to one of skill in the art with the benefit and insight of the present disclosure. During operation of power converter 200, driver 286 may receive logical control signals from microcontroller 284 and, in response to the received logical control signals, output driver control signals effective to actuate (e.g., open and close) the plurality of power switches 240.

The plurality of power switches 230 and the plurality of power switches 240 are also electrical coupled with power connector 281 and power connector 283. In the illustrated embodiment, power connector 281 and power connector 283 are coupled with surface 217 of the child circuit board 210. In other embodiments, power connector 281 and power connector 283 may be coupled with child circuit board 220, parent circuit board 205, or other mounting locations. In the illustrated embodiment, power connector 281 is conductively coupled with and receives a DC power input (DC_in) from a power source and power connector 283 is conductively coupled with and provides a converted (e.g., boosted) DC power output (DC_out) to a load. In the illustrated embodiment, the plurality of power switches 230 and the plurality of power switches 240 are configured and coupled in a parallel arrangement relative to power connector 281 and power connector 283. In other embodiments, the plurality of power switches 230 and the plurality of power switches 240 may be configured and coupled in a series arrangement, a parallel-series arrangement, or other arrangements as will occur to one of skill in the art with the benefit and insight of the present disclosure. Furthermore, in other embodiments, additional power connector terminals may be provided and may be dedicated to the plurality of power switches 240.

In the embodiment, of FIG. 2, the thermal conductor core 250, is provided in the form of a thermally conductive bus bar and is conductively thermally coupled with a condenser 260. Condenser 260 may be contained within the housing 135 of HCU 134 or may include one or more portions 260' extending exterior of the housing 135. In the illustrated embodiment, the condenser 260 includes an active cooling fan system 264 which is contained in the housing 135 which is configured to facilitate heat transfer from the condenser 260 to the surrounding environment. In other embodiments, the active cooling fan system 264 may be provided at and coupled with the one or more portions 260' extending exterior of the housing 135. In other embodiments, the active cooling fan system 264 may be omitted and the condenser 260 may be passively cooled.

In the illustrated embodiment, power converter 200 is depicted as including two child circuit boards (child circuit board 210 and child circuit board 220) which are operatively coupled with respective surfaces of the parent circuit board 205. Some embodiments may include additional child circuit boards. For example, some embodiments, may include one or more additional child circuit boards coupled with surface 251 of the parent circuit board 205, and/or one or more additional child circuit boards coupled with surface 252 of the parent circuit board 205. Such additional child circuit boards may include the same or substantially similar features to those described in connection with child circuit board 210 and child circuit board 220, or may vary therefrom, for example, according to the variations and alternatives described herein.

Figure 5:
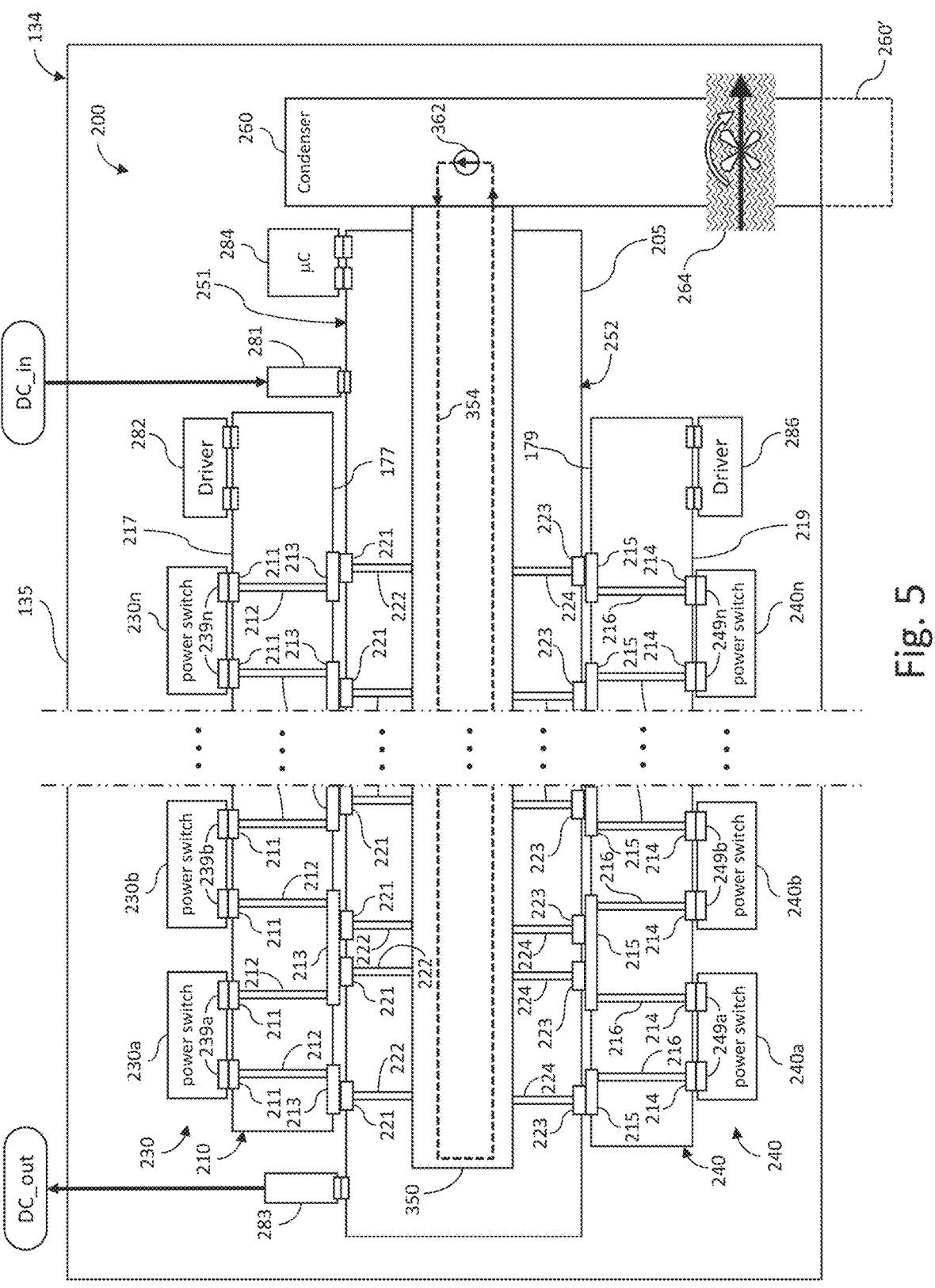
FIG. 5 is a partially schematic diagram illustrating certain aspects of another example power converter.

With reference to FIG. 5, there is illustrated another example embodiment of the HCU 134. In the embodiment of FIG. 5, the thermal conductor core comprises a heat pipe 350. The heat pipe comprises one or more coolant flow paths 354 which extend through and are in conductive thermal communication with the heat pipe 350 and the condenser 260 to form one or more closed loops through which coolant fluid may circulate. A coolant pump 362 may be provided in the condenser 260 (or in other structures of power converter 200 or HCU 134) and configured to pump coolant through one or more loops of the one or more coolant flow paths 354.

As shown by this detailed description, the present disclosure contemplates multiple and various embodiments, including, without limitation, the following example embodiments.

A first example embodiment is a power converter apparatus comprising: a parent circuit board comprising a first surface facing a first direction, a second surface facing a second direction oriented away from the first direction, and a thermal conductor core disposed intermediate the first surface and the second surface; a first child circuit board operatively coupled with the first surface of the parent circuit board; a first plurality of power switches operatively coupled with the first child circuit board; a second child circuit board operatively coupled with the second surface of the parent circuit board; a second plurality of power switches operatively coupled with the second child circuit board; a first heat transfer circuit comprising first set of conductors thermally conductively coupling the first plurality of power switches with the thermal conductor core; and a second heat transfer circuit comprising a second set of conductors thermally conductively coupling the second plurality of power switches with the thermal conductor core.

A second example embodiment includes the features of the first example embodiment, wherein the first set of conductors comprises: a first plurality of pads thermally conductively coupled with the first plurality of power switches, a first plurality of vias thermally conductively coupled with the first plurality of pads and extending through the first child circuit board, a second plurality of pads disposed on a second surface of the first child circuit board and thermally conductively coupled with the first plurality of vias, a third plurality of pads disposed on the first surface of the parent circuit board and thermally conductively coupled with the second plurality of pads, and a second plurality of vias thermally conductively coupled with the third plurality of pads, extending into the parent circuit board, and thermally conductively coupled with the thermal conductor core.

A third example embodiment includes the features of the first example embodiment, wherein the second set of conductors comprises: a fourth plurality of pads thermally conductively coupled with the second plurality of power switches, a third plurality of vias thermally conductively coupled with the fourth plurality of pads and extending through the second child circuit board, a fifth plurality of pads disposed on a second surface of the second child circuit board and thermally conductively coupled with the third plurality of vias, a sixth plurality of pads disposed on the second surface of the parent circuit board and thermally conductively coupled with the fifth plurality of pads, and a fourth plurality of vias thermally conductively coupled with the sixth plurality of pads, extending into the parent circuit board, and thermally conductively coupled with the thermal conductor core.

A fourth example embodiment includes the features of the third example embodiment, wherein the first plurality of power switches are soldered to the first plurality of pads, the second plurality of pads are soldered to the third plurality of pads, the second plurality of power switches are soldered to the fourth plurality of pads, and the fourth plurality of pads are soldered to the third plurality of pads.

A fifth example embodiment includes the features of the first example embodiment, comprising a microcontroller operatively coupled with one of the first surface of the parent circuit board and the second surface of the parent circuit board.

A sixth example embodiment includes the features of the first example embodiment, wherein the thermal conductor core comprises a bus bar.

A seventh example embodiment includes the features of the first example embodiment, wherein the thermal conductor core comprises a heat pipe.

An eighth example embodiment includes the features of the seventh example embodiment, wherein the heat pipe is operatively coupled with a condenser to form a closed loop coolant flow path including a coolant pump configured to pump coolant through the closed loop coolant flow path.

A ninth example embodiment includes the features of the first example embodiment, comprising a condenser thermally conductively coupled with the thermal conductor core.

A tenth example embodiment includes the features of the ninth example embodiment, comprising a housing containing the parent circuit board, the first child circuit board, the first plurality of power switches, the second child circuit board operatively coupled with the second surface of the parent circuit board, the second plurality of power switches, the first heat transfer circuit, and the second heat transfer circuit, wherein the condenser is one of: (a) an actively fan cooled condenser disposed within a housing, and (b) a passively cooled condenser disposed external to a housing.

An eleventh example embodiment is a process of assembling a power converter apparatus, the process comprising: operatively coupling a first plurality of power switches with a first child circuit board; operatively coupling the first child circuit board with a first surface of a parent circuit board with the first plurality of power switches, the parent circuit board comprising the first surface facing a first direction, a second surface facing a second direction oriented away from the first direction, and a thermal conductor core disposed in the parent circuit board and extending intermediate the first surface and the second surface; operatively coupling a second plurality of power switches with a second child circuit board; and operatively coupling the second child circuit board with the second surface of the parent circuit board with the second plurality of power switches; wherein the operatively coupling the first plurality of power switches, the operatively coupling the first child circuit board, the operatively coupling the second plurality of power switches, and the operatively coupling the second child circuit board are effective to form a heat transfer circuit comprising first set of conductors thermally conductively coupling the first plurality of power switches with the thermal conductor core and a second set of conductors thermally conductively coupling the second plurality of power switches with the thermal conductor core.

A twelfth example embodiment includes the features of the eleventh example embodiment, wherein the first set of conductors comprises: a first plurality of pads thermally conductively coupled with the first plurality of power switches, a first plurality of vias thermally conductively coupled with the first plurality of pads and extending through the first child circuit board, a second plurality of pads disposed on a second surface of the first child circuit board and thermally conductively coupled with the first plurality of vias, a third plurality of pads disposed on the first surface of the parent circuit board and thermally conductively coupled with the second plurality of pads, and a second plurality of vias thermally conductively coupled with the third plurality of pads, extending into the parent circuit board, and thermally conductively coupled with the thermal conductor core.

A thirteenth example embodiment includes the features of the twelfth example embodiment, comprising soldering the first plurality of power switches to the first plurality of pads, and soldering the second plurality of pads to the third plurality of pads.

A fourteenth example embodiment includes the features of the twelfth example embodiment, wherein the second set of conductors comprises: a fourth plurality of pads thermally conductively coupled with the second plurality of power switches, a third plurality of vias thermally conductively coupled with the fourth plurality of pads and extending through the second child circuit board, a fifth plurality of pads disposed on a second surface of the second child circuit board and thermally conductively coupled with the third plurality of vias, a sixth plurality of pads disposed on the second surface of the parent circuit board and thermally conductively coupled with the fifth plurality of pads, and a fourth plurality of vias thermally conductively coupled with the sixth plurality of pads, extending into the parent circuit board, and thermally conductively coupled with the thermal conductor core.

A fifteenth example embodiment includes the features of the fourteenth example embodiment, comprising soldering the second plurality of power switches to the fourth plurality of pads, and soldering the fourth plurality of pads to the third plurality of pads.

A sixteenth example embodiment includes the features of the eleventh example embodiment, wherein the thermal conductor core comprises a bus bar.

A seventeenth example embodiment includes the features of the eleventh example embodiment, wherein the thermal conductor core comprises a heat pipe.

An eighteenth example embodiment includes the features of the seventeenth example embodiment, comprising circulating coolant through a closed loop coolant flow path of the heat pipe.

A nineteenth example embodiment includes the features of the eleventh example embodiment, cooling the thermal conductor core with a condenser thermally conductively coupled with the thermal conductor core.

A twentieth example embodiment includes the features of the nineteenth example embodiment, comprising providing a housing containing the parent circuit board, a microcontroller, the first child circuit board, the first plurality of power switches, the second child circuit board operatively coupled with the second surface of the parent circuit board, the second plurality of power switches, and the heat transfer circuit.

It shall be appreciated that terms such as "a non-transitory memory," "a non-transitory memory medium," and "a non-transitory memory device" refer to a number of types of devices and storage mediums which may be configured to store information, such as data or instructions, readable or executable by a processor or other components of a computer system and that such terms include and encompass a single or unitary device or medium storing such information, multiple devices or media across or among which respective portions of such information are stored, and multiple devices or media across or among which multiple copies of such information are stored.

It shall be appreciated that terms such as "determine," "determined," "determining" and the like when utilized in connection with a control method or process, an electronic control system or controller, electronic controls, or components or operations of the foregoing refer inclusively to a number of acts, configurations, devices, operations, and techniques including, without limitation, calculation or computation of a parameter or value, obtaining a parameter or value from a lookup table or using a lookup operation, receiving parameters or values from a datalink or network communication, receiving an electronic signal (e.g., a voltage, frequency, current, or pulse-width modulation (PWM) signal) indicative of the parameter or value, receiving output of a sensor indicative of the parameter or value, receiving other outputs or inputs indicative of the parameter or value, reading the parameter or value from a memory location on a computer-readable medium, receiving the parameter or value as a run-time parameter, and/or by receiving a parameter or value by which the interpreted parameter can be calculated, and/or by referencing a default value that is interpreted to be the parameter value.

While example embodiments of the disclosure have been illustrated and described in detail in the drawings and foregoing description, the same is to be considered as illustrative and not restrictive in character, it being understood that only certain example embodiments have been shown and described and that all changes and modifications that come within the spirit of the claimed inventions are desired to be protected. It should be understood that while the use of words such as preferable, preferably, preferred or more preferred utilized in the description above indicates that the feature so described may be more desirable, it nonetheless may not be necessary and embodiments lacking the same may be contemplated as within the scope of the invention, the scope being defined by the claims that follow. In reading the claims, it is intended that when words such as "a," "an," "at least one," or "at least one portion" are used there is no intention to limit the claim to only one item unless specifically stated to the contrary in the claim. When the language "at least a portion" and/or "a portion" is used the item can include a portion and/or the entire item unless specifically stated to the contrary.

The invention claimed is:

1. A power converter apparatus comprising:
a parent circuit board comprising a first surface facing a first direction, a second surface facing a second direction oriented away from the first direction, and a thermal conductor core disposed intermediate the first surface and the second surface;
a first child circuit board operatively coupled with the first surface of the parent circuit board;
a first plurality of power switches operatively coupled with the first child circuit board;
a second child circuit board operatively coupled with the second surface of the parent circuit board;
a second plurality of power switches operatively coupled with the second child circuit board;
a first heat transfer circuit comprising first set of conductors thermally conductively coupling the first plurality of power switches with the thermal conductor core; and
a second heat transfer circuit comprising a second set of conductors thermally conductively coupling the second plurality of power switches with the thermal conductor core.

2. The power converter apparatus of claim 1, wherein the first set of conductors comprises:
a first plurality of pads thermally conductively coupled with the first plurality of power switches,
a first plurality of vias thermally conductively coupled with the first plurality of pads and extending through the first child circuit board,
a second plurality of pads disposed on a second surface of the first child circuit board and thermally conductively coupled with the first plurality of vias, a third plurality of pads disposed on the first surface of the parent circuit board and thermally conductively coupled with the second plurality of pads, and a second plurality of vias thermally conductively coupled with the third plurality of pads, extending into the parent circuit board, and thermally conductively coupled with the thermal conductor core.

3. The power converter apparatus of claim 2, wherein the second set of conductors comprises:

a fourth plurality of pads thermally conductively coupled with the second plurality of power switches, a third plurality of vias thermally conductively coupled with the fourth plurality of pads and extending through the second child circuit board, a fifth plurality of pads disposed on a second surface of the second child circuit board and thermally conductively coupled with the third plurality of vias, a sixth plurality of pads disposed on the second surface of the parent circuit board and thermally conductively coupled with the fifth plurality of pads, and a fourth plurality of vias thermally conductively coupled with the sixth plurality of pads, extending into the parent circuit board, and thermally conductively coupled with the thermal conductor core.

4. The power converter apparatus of claim 3, wherein the first plurality of power switches are soldered to the first plurality of pads, the second plurality of pads are soldered to the third plurality of pads, the second plurality of power switches are soldered to the fourth plurality of pads, and the fourth plurality of pads are soldered to the third plurality of pads.

5. The power converter apparatus of claim 1, further comprising a microcontroller operatively coupled with one of the first surface of the parent circuit board and the second surface of the parent circuit board.

6. The power converter apparatus of claim 1, wherein the thermal conductor core comprises a bus bar.

7. The power converter apparatus of claim 1, wherein the thermal conductor core comprises a heat pipe.

8. The power converter apparatus of claim 7, wherein the heat pipe is operatively coupled with a condenser to form a closed loop coolant flow path including a coolant pump configured to pump coolant through the closed loop coolant flow path.

9. The power converter apparatus of claim 1, further comprising a condenser thermally conductively coupled with the thermal conductor core.

10. The power converter apparatus of claim 9, further comprising a housing containing the parent circuit board, the first child circuit board, the first plurality of power switches, the second child circuit board operatively coupled with the second surface of the parent circuit board, the second plurality of power switches, the first heat transfer circuit, and the second heat transfer circuit, wherein the condenser is one of: (a) an actively fan cooled condenser disposed within the housing, and (b) a passively cooled condenser disposed external to the housing.

11. A process of assembling a power converter apparatus, the process comprising:

operatively coupling a first plurality of power switches with a first child circuit board;

operatively coupling the first child circuit board with a first surface of a parent circuit board with the first plurality of power switches, the parent circuit board comprising the first surface facing a first direction, a second surface facing a second direction oriented away from the first direction, and a thermal conductor core disposed in the parent circuit board and extending intermediate the first surface and the second surface;

operatively coupling a second plurality of power switches with a second child circuit board; and operatively coupling the second child circuit board with the second surface of the parent circuit board with the second plurality of power switches;

wherein the operatively coupling the first plurality of power switches, the operatively coupling the first child circuit board, the operatively coupling the second plurality of power switches, and the operatively coupling the second child circuit board are effective to form a heat transfer circuit comprising first set of conductors thermally conductively coupling the first plurality of power switches with the thermal conductor core and a second set of conductors thermally conductively coupling the second plurality of power switches with the thermal conductor core.

12. The process of claim 11, wherein the first set of conductors comprises:

a first plurality of pads thermally conductively coupled with the first plurality of power switches, a first plurality of vias thermally conductively coupled with the first plurality of pads and extending through the first child circuit board, a second plurality of pads disposed on a second surface of the first child circuit board and thermally conductively coupled with the first plurality of vias, a third plurality of pads disposed on the first surface of the parent circuit board and thermally conductively coupled with the second plurality of pads, and a second plurality of vias thermally conductively coupled with the third plurality of pads, extending into the parent circuit board, and thermally conductively coupled with the thermal conductor core.

13. The process of claim 12, further comprising soldering the first plurality of power switches to the first plurality of pads, and soldering the second plurality of pads to the third plurality of pads.

14. The process of claim 12, wherein the second set of conductors comprises:

a fourth plurality of pads thermally conductively coupled with the second plurality of power switches, a third plurality of vias thermally conductively coupled with the fourth plurality of pads and extending through the second child circuit board, a fifth plurality of pads disposed on a second surface of the second child circuit board and thermally conductively coupled with the third plurality of vias, a sixth plurality of pads disposed on the second surface of the parent circuit board and thermally conductively coupled with the fifth plurality of pads, and a fourth plurality of vias thermally conductively coupled with the sixth plurality of pads, extending into the parent circuit board, and thermally conductively coupled with the thermal conductor core.

15. The process of claim 14, further comprising soldering the second plurality of power switches to the fourth plurality of pads, and soldering the fourth plurality of pads to the third plurality of pads.

16. The process of claim 11, wherein the thermal conductor core comprises a bus bar.

17. The process of claim 11, wherein the thermal conductor core comprises a heat pipe.

18. The process of claim 17, further comprising circulating coolant through a closed loop coolant flow path of the heat pipe.

19. The process of claim 11, further comprising cooling the thermal conductor core with a condenser thermally conductively coupled with the thermal conductor core.

20. The process of claim 19, further comprising providing a housing containing the parent circuit board, a microcontroller, the first child circuit board, the first plurality of power switches, the second child circuit board operatively coupled with the second surface of the parent circuit board, the second plurality of power switches, and the heat transfer circuit.

\* \* \* \* \*